United States Patent
Hirono et al.

(10) Patent No.: US 6,756,793 B2
(45) Date of Patent: Jun. 29, 2004

(54) CAPACITANCE TYPE MOISTURE SENSOR AND METHOD OF PRODUCING THE SAME

(75) Inventors: Atsuyuki Hirono, Kobe (JP); Hideo Mori, Hirakata (JP); Yuji Takada, Kyoto (JP); Keisuke Yoshikawa, Nishinomiya (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/897,077

(22) Filed: Jul. 3, 2001

(65) Prior Publication Data

US 2002/0000813 A1 Jan. 3, 2002

(30) Foreign Application Priority Data

Jul. 3, 2000 (JP) .......................................... 2000-201620
Jul. 3, 2000 (JP) .......................................... 2000-201621

(51) Int. Cl.[7] .......................... G01R 27/26; G01N 19/00
(52) U.S. Cl. ..................................... 324/690; 73/335.04
(58) Field of Search ................................. 324/690, 686, 324/658, 664, 689; 73/73, 74, 335.2, 335.04, 29.05

(56) References Cited

U.S. PATENT DOCUMENTS

| | | | |
|---|---|---|---|
| 3,350,941 A | * 11/1967 | Sullivan et al. | 73/335.04 |
| 3,391,337 A | 7/1968 | Preikschat | 624/666 |
| 3,582,728 A | * 6/1971 | Thoma | 361/286 |
| 3,802,268 A | * 4/1974 | Thoma | 73/335.04 |
| 4,135,151 A | 1/1979 | Rogers et al. | 324/664 |
| 4,845,421 A | * 7/1989 | Howarth et al. | 324/688 |
| 4,936,333 A | 6/1990 | Bireley | 137/78.3 |
| 6,249,130 B1 | * 6/2001 | Greer | 324/687 |

FOREIGN PATENT DOCUMENTS

| | | |
|---|---|---|
| DE | 196 15 715 | 11/1997 |
| FR | 1.338.870 | 10/1963 |

OTHER PUBLICATIONS

European Search Report of Mar. 14, 2003.

* cited by examiner

*Primary Examiner*—Michael Nghiem
(74) *Attorney, Agent, or Firm*—Rader, Fishman & Grauer PLLC

(57) ABSTRACT

A capacitance type moisture sensor having the capability of accurately detecting amounts of water is provided. This sensor has a sensor housing having an electrically-insulating wall, a pair of electrodes disposed on the sensor housing, and a circuit unit. An outer surface of the electrically-insulating wall faces a space where the amounts of water should be detected. On an inner surface of the electrically-insulating wall, at least one of the electrodes is formed. An electric field developed between the electrodes is defined as a moisture detecting region. The circuit unit includes a capacitance detecting circuit for detecting a capacitance value between the electrodes, which changes in response to the amounts of water in the moisture detecting region, and an output circuit for providing an electrical signal corresponding toe the amounts of water according the capacitance value detected by the capacitance detecting circuit.

24 Claims, 15 Drawing Sheets

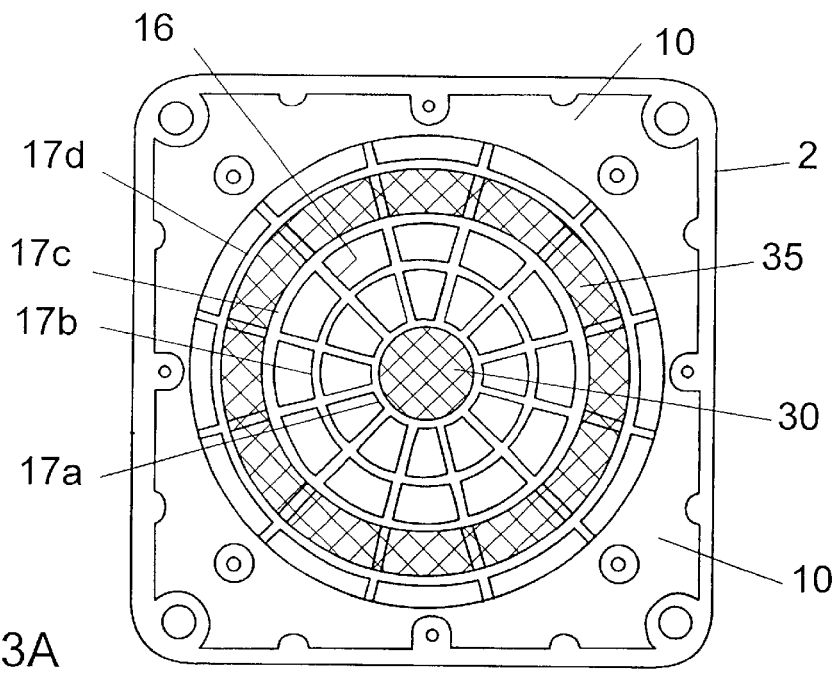
FIG. 3A
FIG. 3B
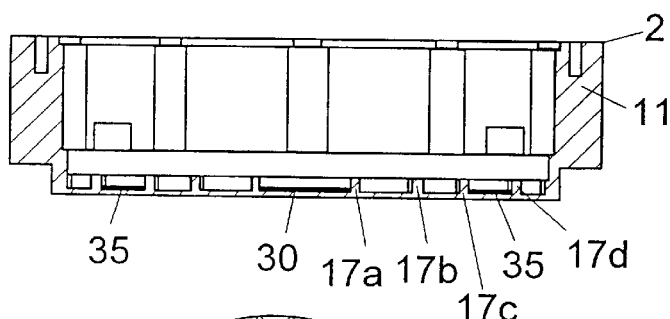
FIG. 3C
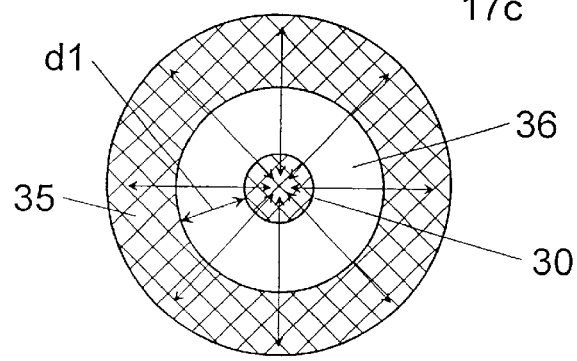
FIG. 3D
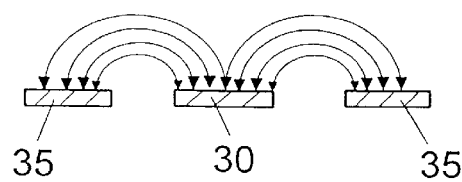

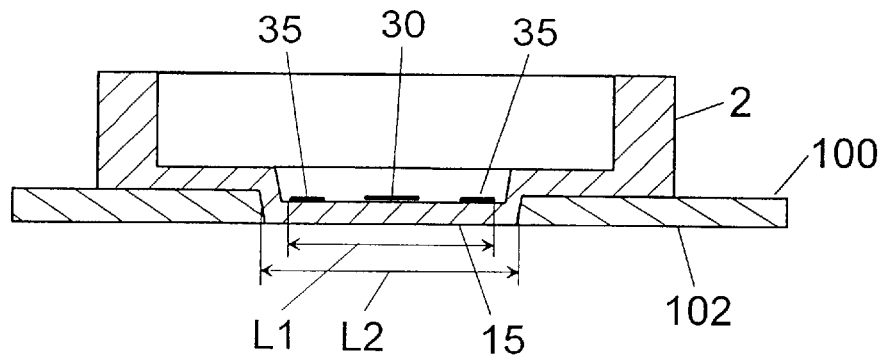
FIG. 7
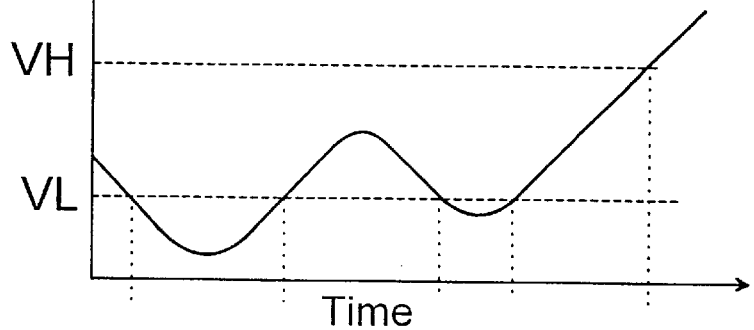
FIG. 8A
FIG. 8B

CAPACITANCE TYPE MOISTURE SENSOR AND METHOD OF PRODUCING THE SAME

BACKGROUND OF THE INVENTION

1. Field of the Invention

The present invention relates to a capacitance type moisture sensor having the capability of accurately detecting amounts of water, and a method of producing the same sensor.

2. Disclosure of the Prior Art

Capacitance type moisture sensor is known as a kind of conventional moisture sensor, and detects amounts of water from a change of capacitance between a pair of electrodes in accordance with the nature that water is a polarization (dielectric) material.

For example, this type of moisture sensor is built in a garbage disposing apparatus, and used to detect amounts of water in the garbage. That is, as shown in FIGS. 21A and 21B, the moisture sensor comprises an electrically-insulating panel 2P, which is attached to an opening formed in a garbage vessel 100P of the garbage disposing apparatus, a pair of electrodes 30P, 35P arranged in parallel on the electrically-insulating panel, a capacitance detecting circuit 40P for detecting a capacitance value (Cx) between the electrodes, and an output circuit 42P for providing an electrical signal corresponding to the amounts of water according to outputs from the capacitance detecting circuit.

In this moisture sensor, the amounts of water (M) is represented by the equation (1):

$$M=V/(S*d) \quad (1)$$

wherein "V" is a volume of water, "S" is an area of the electrode, "d" is a distance between the electrodes. Therefore, "S*d" gives a volume of a moisture detection region. A relationship between the amounts of water (M) and the capacitance (Cx) is shown in FIG. 22. This relationship is also expressed by the following equation (2):

$$Cx=[\in1'(water)*M+\in2'(others)*(1-M)]\times\in0*S/d \quad (2)$$

wherein ($\in1'$) is the dielectric constant of water (=80) and ($\in2'$) is a relative dielectric constant of a material other than water. For example, when the material other than water is woods, the relative dielectric constant ($\in2'$) is 2. When the material other than water is the air, the relative dielectric constant ($\in2'$) is 1. Thus, the capacitance (Cx) can be determined by the amounts of water in the detection region. In addition, the capacitance value (Cx) depends on the electrode size.

However, there is still plenty of room for improvement in the conventional moisture sensor from the following viewpoints. That is, since these electrodes project toward the interior of the garbage vessel, a space between the electrodes is easily filled with the garbage. In this case, the capacitance detecting circuit may detect only the amounts of water of the garbage caught between the electrodes. Therefore, to accurately detect a change of the amounts of water of the garbage in the garbage vessel, a cleaning mechanism for frequently removing the garbage caught between the electrodes is needed. This leads to an increase in production cost.

In addition, since the garbage is usually stirred in the garbage vessel to facilitate decomposition of the garbage, there is a problem that a breakage of the moisture sensor is accidentally caused by a collision of the garbage with the electrodes. Moreover, the electrically-insulating panel supporting the electrodes needs a mechanical strength sufficient for withstanding a load for stirring. This also leads to a further increase in production cost.

SUMMARY OF THE INVENTION

Therefore, a primary object of the present invention is to provide a capacitance type moisture sensor, which can accurately detect amounts of water of an object in a real-time manner without using the above-described cleaning mechanism for electrodes.

That is, this moisture sensor comprises a sensor housing having a electrically-insulating wall, a pair of electrodes disposed on the sensor housing, and a circuit unit. An outer surface of the electrically-insulating wall faces a space where amounts of water should be detected. On an inner surface of the electrically-insulating wall, at least one of the electrodes is formed. An electric field developed between the electrodes is defined as a moisture detecting region. The circuit unit includes a capacitance detecting circuit for detecting a capacitance value between the electrodes, which changes in response to the amounts of water in the moisture detecting region, and an output circuit for providing an electrical signal corresponding to the amounts of water according to the capacitance value detected by the capacitance detecting circuit.

With respect to the moisture sensor of the present invention, since the electric field developed between the electrodes provides the moisture detecting region outside the sensor housing through the electrically-insulating wall, it is not necessary to allow the electrodes to project toward the space where the amounts of water should be detected. In particular, when the moisture sensor is used in a garbage disposing apparatus, it is possible to eliminate the problem that the breakage of the moisture sensor is caused by the collision of the garbage with the electrodes, and accurately detect the amounts of water in the garbage in the real-time manner, while preventing the increase in production cost.

In the above moisture sensor, it is preferred that at least one of the electrodes is a metal film deposited on the inner surface of the electrically-insulating wall. In this case, even when the electrically-insulating wall has a curved surface, good adhesion strength between the electrode(s) and the electrically-insulating wall can be obtained. In addition, it is possible to easily form the electrodes on the sensor housing having a complex shape. Moreover, even when a plurality of ribs described later are formed on the inner surface of the electrically-insulating wall, it is possible to easily form a desired electrode pattern. Alternatively, the electrodes may be formed by means of an insert molding, or metal bonding.

With respect to the above moisture sensor, it is preferred that the sensor housing has a concave formed in an inner surface of a bottom wall thereof and a convex formed on an outer surface of the bottom wall at a position opposed to the concave, and a bottom surface of the concave is the inner surface of the insulating wall and a top surface of the convex is the outer surface of the insulating wall. In this case, for example, when the moisture sensor of the present invention is attached to a garbage vessel of the garbage disposing apparatus, only the top surface of the convex is exposed to the interior of the garbage vessel. Therefore, it is possible to minimize an area of the moisture sensor exposed to the garbage put in the garbage vessel. In addition, since the moisture sensor is attached to the garbage vessel such that the top surface of the convex is flush with the inner surface of the garbage vessel, it is possible to avoid a situation that a movement of the garbage in the garbage vessel by stirring is obstructed, or a situation that an excessive force is loaded to the moisture sensor by the stirring.

With respect to the above moisture sensor, it is preferred that the pair of electrodes are composed of a ring-shaped electrode having an open center and a central electrode, which is disposed in the open center of the ring-shaped electrode such that a circumference of the central electrode is spaced from an inner circumference of the ring-shaped electrode by a constant distance. In particular, it is preferred that the pair of electrodes are composed of a ring-shaped electrode having an annular open center and a central electrode having a circular shape, and the ring-shaped electrode is disposed in a concentric manner with respect to the central electrode such that an outer circumference of the central electrode is spaced from an inner circumference of the ring-shaped electrode by a constant distance. Alternatively, it is preferred that the pair of electrodes are composed of a ring-shaped electrode having a rectangular open center and a central electrode having a rectangular shape, which is disposed in the open center of the ring-shaped electrode such that an outer circumference of the central electrode is spaced from an inner circumference of the ring-shaped electrode by a constant distance. In these cases, since the distance between the electrodes is constant over the entire circumference of the central electrode, it is possible to obtain the same density of electric flux line on the respective electrodes, and stably provide further accurate detection of the amounts of water by reducing the stray capacitance.

With respect to the above moisture sensor, it is preferred that the sensor housing has a plurality of first ribs projecting on the inner surface of the electrically-insulating wall of the concave, which extend in directions of electric field developed between the electrodes. In other words, it is preferred that the sensor housing has a plurality of first ribs projecting on the inner surface of the electrically-insulating wall of the concave, which radially extend from a center of the central electrode. In addition, it is preferred that the sensor housing has at least one second rib projecting on the inner surface of the electrically-insulating wall of the concave such that an extending direction of the second rib is substantially perpendicular to a direction of electric field developed between the electrodes. In other words, it is preferred that the sensor housing has at least one second rib projecting on the inner surface of the electrically-insulating wall of the concave, which extends in a concentric manner with respect to the central electrode. In these cases, it is possible to prevent the non-uniformity of electric-field distribution by forming the first ribs radially extending from the center of the central electrode and the second rib(s) extending in the concentric manner with respect to the central electrode, to thereby accurately detect the amounts of water. In addition, the mechanical strength of the electrically-insulating wall can be improved. Moreover, when the electrodes are connected to a printed circuit board mounting electronic parts of the control unit by soldering a lead wire therebetween, the ribs can work as a barrier for stopping a flow of the solder. These ribs also work as guide means that facilitates the positioning of the electrodes.

With respect to the above moisture sensor, it is preferred that a width of the ring-shaped electrode is substantially equal to the width of the central electrode. In this case, since amounts of electric flux line provided from one of the electrodes are equal to the amounts of electric flux line provided from the other electrode, it is possible to reduce the influence of stray capacitance.

With respect to the above moisture sensor, it is preferred that the circuit unit comprises a signal processing means for detecting an unusual state by comparing a change of the amounts of water corresponding to the electric signal provided from the output circuit with a predetermined value. In this case, it is possible to detect the occurrence of such an unusual state in the space where the amounts of water should be detected, and give an alarm to the user.

With respect to the above moisture sensor, it is preferred that an exposed surface of each of the electrodes is coated with an electrically-insulating material. In addition, after the pair of electrodes are formed on the bottom of the concave of the sensor housing, it is preferred that an electrically-insulating material is filled in the concave. It is useful to prevent a situation that a short circuit between the electrodes is caused by condensation.

In addition, it is preferred that the above moisture sensor comprises a shied case composed of a bottom wall having an aperture and side walls projecting upward from the circumference of the bottom wall, which is disposed in the sensor housing such that the concave of the sensor housing is exposed to the interior of the shield case through the aperture, and the shield case is connected to a zero-voltage point of the capacitance detecting circuit. In particular, it is preferred that the above moisture sensor comprises a shield cover disposed in the sensor housing, and a printed circuit board mounting electronic parts of the circuit unit is housed between the shield case and the shield cover. By using the shield cover and shield case, electric wave that comes from the outside is shielded to prevent a faulty operation of the moisture sensor. In addition, since a leakage of electric wave from the moisture sensor is prevented, it is possible to avoid a bad influence to an electric appliance outside.

In addition, it is preferred that the above moisture sensor comprises an electric wave shield layer formed by depositing a metal material on an internal surface of the sensor housing other than the concave, and the shield layer is connected to a zero-voltage point of the capacitance detecting circuit. In particular, it is preferred that electrical connections between the electrodes and a printed circuit board mounting electronic parts of the circuit unit, and between the electric wave shield layer and the printed circuit board are made by use of a metal film deposited. In these cases, when depositing the metal material on the sensor housing to form the electrodes, it is possible to simultaneously form metal films for the electric wave shield layer and the electrical connections. Therefore, the production cost of the moisture sensor can be remarkably reduced.

A preferred method of producing the above moisture sensor comprises the steps of molding a synthetic resin material to obtain the sensor housing; depositing a metal material to form a metal film on the sensor housing; and selectively removing the metal film from the sensor housing to obtain the pair of electrodes. According to this method, it is possible to simultaneously form the electric wave shield layer, the metal films for the electrical connections and the electrodes on the sensor housing.

These and still other objects and advantages will become apparent from the following detail description of preferred embodiments of the invention, referring to the attached drawings.

BRIEF EXPLANATION OF THE DRAWINGS

FIGS. 3A and 3B are a top view and a side cross-sectional view of the sensor housing with electrodes, respectively, and FIGS. 3C and 3D are schematic diagrams showing electric field developed between the electrodes;

FIG. 7 is a partially cross-sectional view of the moisture sensor attached to a garbage vessel of a garbage disposing apparatus;

FIG. 8A is graph showing a change of amounts of water with respect to time, and

FIG. 8B is a diagram showing an operation of a signal processing means in the case of FIG. 8A;

DETAIL DESCRIPTION OF PREFERRED EMBODIMENTS OF THE INVENTION

A capacitance type moisture sensor of the present invention is explained in detail according to preferred embodiments.

Figure 1A:
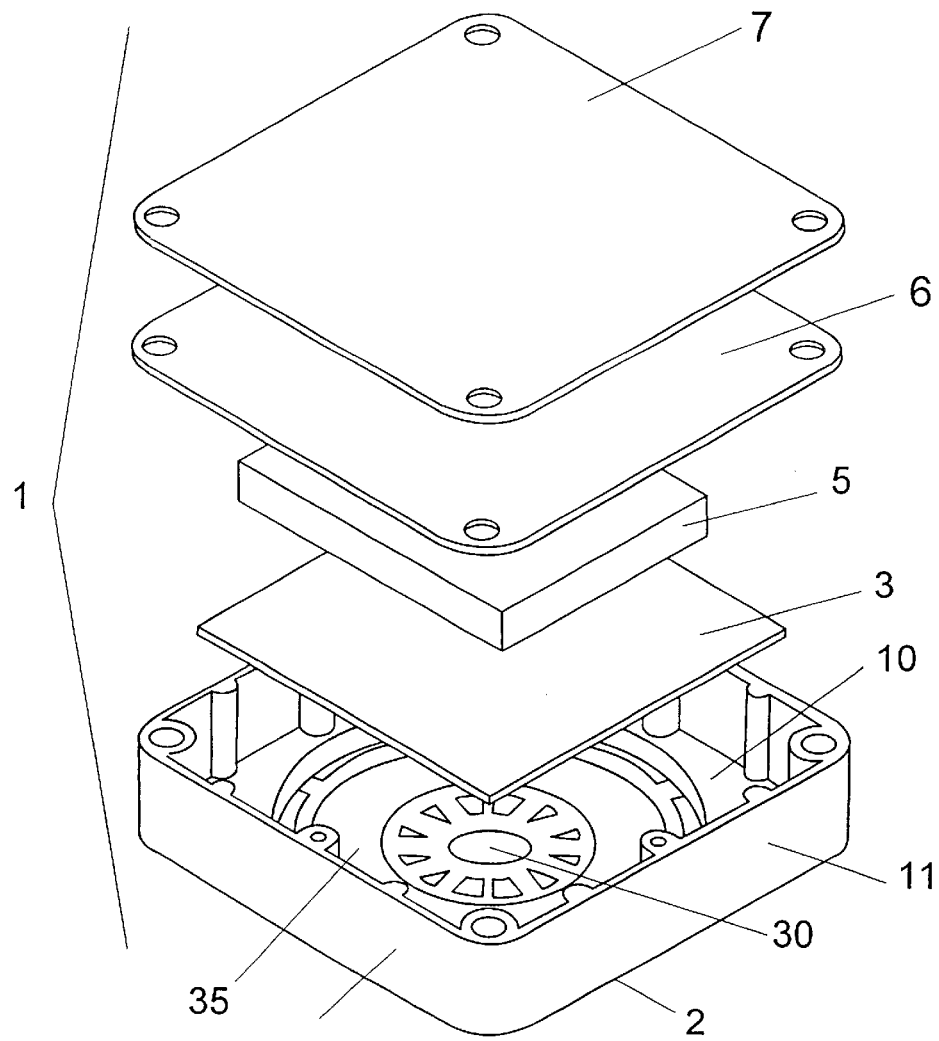
FIGS. 1A and 1B are an exploded perspective view and a cross-sectional view of a capacitance type moisture sensor according to a preferred embodiment of the present invention, respectively.
Figure 1B:
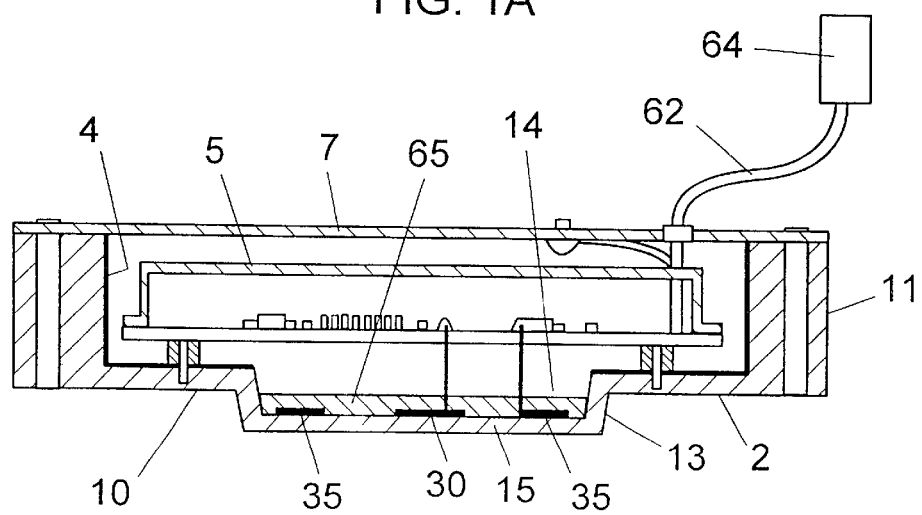
Figure 2A:
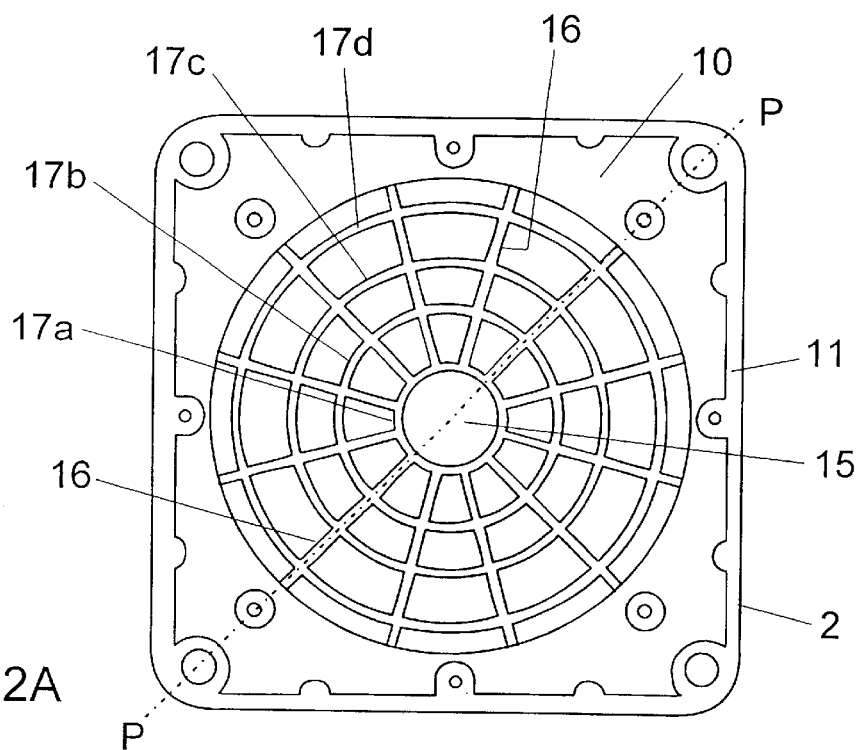
FIGS. 2A to 2D are a top view, side view, side cross-sectional view and a cross-sectional view taken along the line P—P in FIG. 2A of a sensor housing of the moisture sensor, respectively.
Figure 2B:
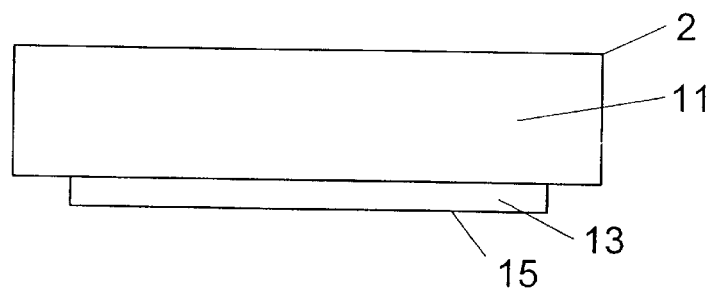
Figure 2C:
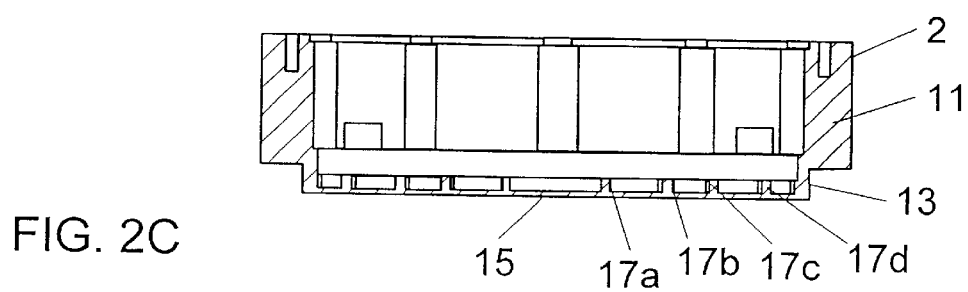
Figure 2D:
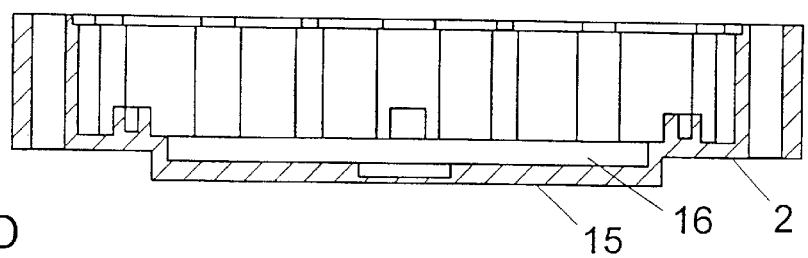

As shown in FIGS. 1A and 1B, the moisture sensor 1 comprises a sensor housing 2, a pair of electrodes 30, 35 disposed in the sensor housing, a printed circuit board 3 mounting electronic parts (not shown) of a circuit unit described later, a shield cover 5, a packing 6, and a conductive cover 7 made of an electrically conductive material, which is attached to a top opening of the sensor housing through the packing 6.

As shown in FIGS. 2A to 2D, the sensor housing 2 has a bottom wall 10 of a substantially square shape, side walls 11 projecting vertically from the circumference of the bottom wall, and a top opening. A circular concave 14 is formed in an inner surface of the bottom wall 10. A bottom of the circular concave is an electrically-insulating wall 15. In addition, a circular convex 13 is formed on an outer surface of the bottom wall 10 at a position opposed to the concave 14. Therefore, the bottom surface of the concave 14 is the inner surface of the electrically-insulating wall 15, and a top surface of the convex 13 is the outer surface of the electrically-insulating wall 15. The outer surface of the electrically-insulating wall 15 faces to a space where amounts of water should be detected. The sensor housing 2 may be made of an electrically-insulating material such as a synthetic resin. In this case, it is possible to use polycarbonate, polypropylene, polyphenylene sulfide, or the like. In addition, it is preferred that a thickness of the electrically-insulating wall 15 is within a range of 0.1 mm to 5 mm.

As shown in FIGS. 3A and 3B, the sensor housing 2 has a plurality of first ribs 16 projecting on the inner surface of the electrically-insulating wall in the concave, which radially extend from a center of the electrically-insulating wall 15 of the concave 14, and a plurality of second ribs 17a–17d projecting on the inner surface of the electrically-insulating wall, which extend in a concentric manner with respect to the center of the electrically-insulating wall 15. In other words, as shown in FIGS. 3C and 3D, the first ribs 16 are formed to extend in a direction of electric field developed between electrodes 30, 35. The second ribs 17a to 17d are formed such that an extending direction of each of the second ribs is substantially perpendicular to the direction of electric field. In this embodiment, twelve first ribs 16 are formed every 30 degrees about the center of the electrode 30. In addition, four second ribs 17a to 17d having different diameters are formed in the concentric manner with respect to the electrode 30.

In this embodiment, the pair of electrodes 30, 35 are disposed on an inner surface of the electrically-insulating wall 15 in the concave. The electrodes are composed of a ring-shaped electrode 35 having an annular open center 36 and a central electrode 30 having a circular shape. The ring-shaped electrode 35 is disposed in a concentric manner with respect to the central electrode 30 such that an outer circumference of the central electrode is spaced from an inner circumference of the ring-shaped electrode by a constant distance d1. That is, as shown in FIGS. 3A and 3B, the central electrode 30 is disposed on an area surrounded by the second rib 17a having the smallest diameter. The ring-shaped electrode 35 can be formed on the entire area between the adjacent second ribs 17c and 17d by depositing a metal film thereon. It is preferred that a width of the ring-shaped electrode 35 is substantially equal to the width of the central electrode 30.

An electric field developed between the electrodes is defined as a moisture detecting region. It is preferred that an additional metal layer is formed on the electrodes by metal plating to improve corrosion resistance of the electrodes. In addition, after a wiring operation for the electrodes is finished, it is preferred that the concave is filled with an electrically-insulating material 65 to prevent a situation that a short circuit is caused between the electrodes when condensation occurs in the sensor housing. As the electrically-insulating material, it is possible to use silicon rubber or epoxy resins.

As an example, these electrodes can be formed by depositing a metal material such as aluminum or copper to form a metal film on the sensor housing, and selectively removing the metal film from the sensor housing according to a required pattern.

Figure 4:
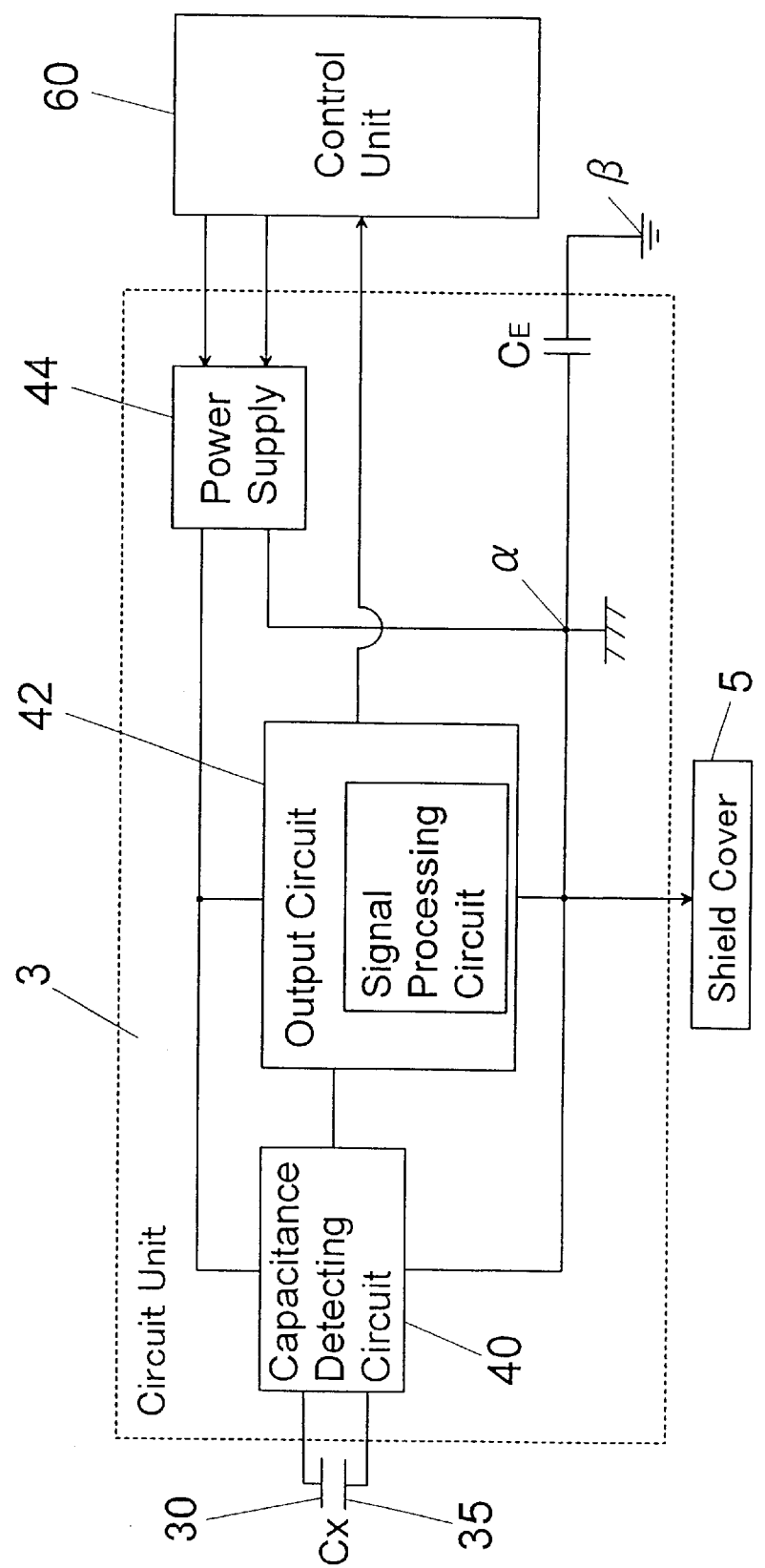
FIG. 4 is a circuit diagram of the moisture sensor.

As shown in FIG. 4, the circuit unit includes a capacitance detecting circuit 40 for detecting a capacitance value Cx between the electrodes 30, 35 that changes in response to amounts of water in the moisture detecting region, output circuit 42 for providing an electrical signal corresponding to the amounts of water, e.g., a voltage signal, according to the capacitance value detected by the capacitance detecting circuit, power supply 44 for supplying electric power to the detecting circuit and the output circuit, and a capacitor $C_E$ connected between the zero-voltage point ($\alpha$) of the circuit of the moisture sensor and the ground ($\beta$) to determine an impedance therebetween.

Figure 5:
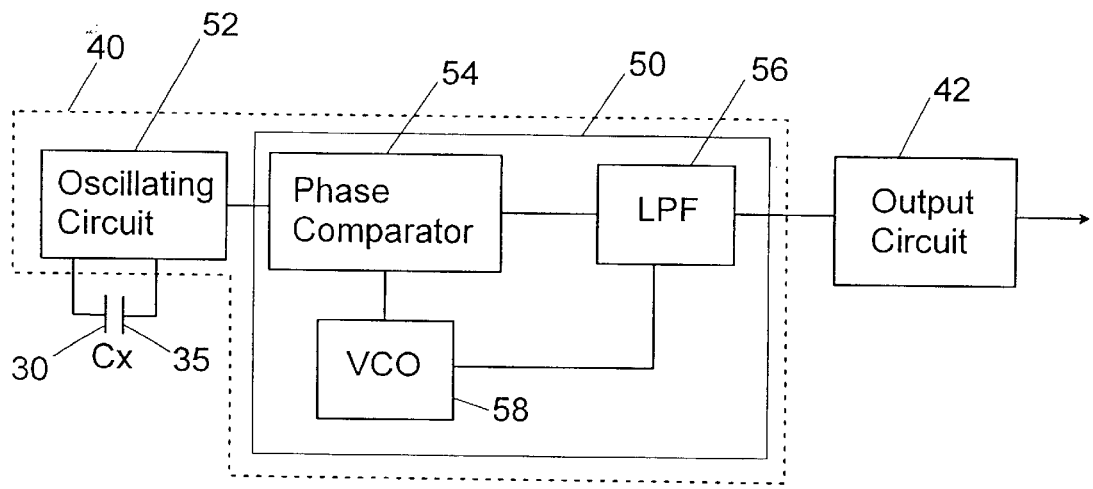
FIG. 5 is a circuit diagram showing details of the PLL circuit of a capacitance detecting circuit of the moisture sensor.

An embodiment of the capacitance detecting circuit 40 is shown in FIG. 5. In this embodiment, the capacitance detecting circuit 40 comprises the PLL (Phase Locked Loop) circuit 50 and an oscillating circuit 52 for determining an oscillating frequency according to the capacitance value Cx that changes in response to the amounts of water in the moisture detecting region. This change of the oscillating frequency is converted into a change of voltage by the PLL circuit 50 composed of phase comparator 54, low-pass filter 55 and VCO (Voltage Controlled Oscillator) 58 to obtain a voltage. According to this voltage change, the output circuit 42 provides a voltage signal corresponding to the amounts of water in the moisture detecting region. That is, when the amounts of water in the moisture detecting region increases (or decreases), the oscillating frequency of the oscillating circuit decreases (or increases). In the PLL circuit 50, when allowing the frequency of the VCO 58 to follow the oscillating frequency of the oscillating circuit, an output voltage of the low-pass filter varies in response to a change of the amounts of water. The output circuit 42 outputs the output voltage corresponding to the amounts of water.

The output voltage is sent to the control unit 60 through a cable 62 having a connector 64. Therefore, an electric power is supplied from the control unit 60 to the power supply 44 through the cable 62, and the output signal of the output circuit 42 is sent to the control unit 60 through the cable.

Since the oscillating circuit oscillates within a range of, for example, several ten MHz to several hundreds MHz, current consumption increases. Due to this reason, a heat radiator plate is needed to the power supply. By using the shield cover 5 as the radiator plate, it is possible to deliver a reduction in component count and downsize the moisture sensor.

Figure 6:
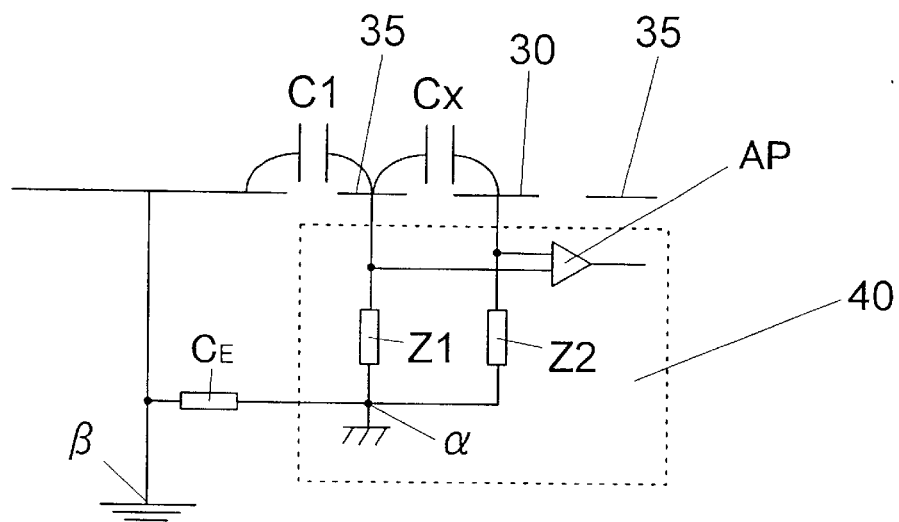
FIG. 6 is a circuit diagram showing a capacitor $C_E$ disposed in the circuit unit.

The zero-voltage point ($\alpha$) of the circuit of the moisture sensor is not electrically connected to the ground ($\beta$). When the garbage vessel is made of a conductive material, it is connected to the ground by an impedance value. Therefore, there is an order of impedance between the zero-voltage point ($\alpha$) and the ground ($\beta$). Since a characteristic of the moisture sensor receives an influence by this impedance value, a capacitor $C_E$ is connected between the zero-voltage point ($\alpha$) and the ground ($\beta$) such that it is sufficiently smaller than the impedance value. The capacitor $C_E$ is a kind of electronic part for determining the impedance between the ground ($\beta$) and the zero-voltage point ($\alpha$). The capacitor can be inserted, as shown in FIG. 6. In this figure, "Z1" and "Z2" designate impedance devices of the oscillating circuit 52. "AP" designates a device of the oscillating circuit for determining the oscillating frequency with reference to the capacitance value Cx. For example, when the moisture sensor is attached to a wall surface of a garbage vessel of a garbage disposing device, a stray capacitance C1 develops between the wall surface and the ring-shaped electrode.

Since the stray capacitance C1 varies in accordance with the amounts of water in the moisture detecting region, it may result in a faulty operation of the capacitance detecting circuit 40. When the relationship between C1 and $C_E$ is C1>>$C_E$ irrespective of the amounts of water, it is possible to prevent the faulty operation by maintaining a constant coupling capacitance between the ring-shaped electrode and the wall surface (the ground). To obtain a large value of the stray capacitance C1, it is preferred to narrow a distance between the wall surface of the garbage vessel and the ring-shaped electrode. For example, as shown in FIG. 7, the outer diameter L1 of the ring-shaped electrode is 90 mm, a diameter L2 of the circular concave 14 that is a concentric relation with the ring-shaped electrode is 110 mm, and the distance between the wall surface of the garbage vessel and the ring-shaped electrode is about 10 mm, it is possible to obtain a large stray capacitance.

It is also preferred that the circuit unit comprises a signal processing means for detecting an unusual state that the moisture content is more than a predetermined upper limit value according to a magnitude of the electric signal provided from the output circuit. In addition, the signal processing unit may detect an unusual state that the moisture content is less than a predetermined lower limit value according to the magnitude of the electric signal provided from the output circuit. In this embodiment, the output circuit has a comparator as the signal processing means. In the comparator, an output of the output circuit such as a voltage signal is compared with a first standard value VH indicating that the moisture content is more than the upper limit, and also with a second standard value VL indicating that the moisture content is less than the lower limit value. When the voltage signal is more than the first standard value VH or less than the second standard value VL, as shown in FIGS. 8A and 8B, the comparator provides an output showing the occurrence of the unusual state to the control unit 60. According to this output, the garbage disposing apparatus may carry out a treatment for the unusual state.

Figure 9A:
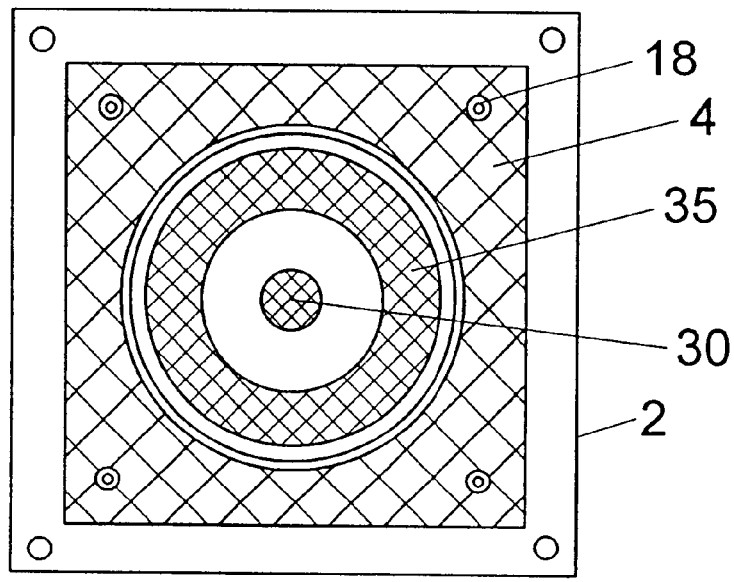
FIGS. 9A and 9B are top views of the sensor housing with an electric wave shield layer.
Figure 9B:
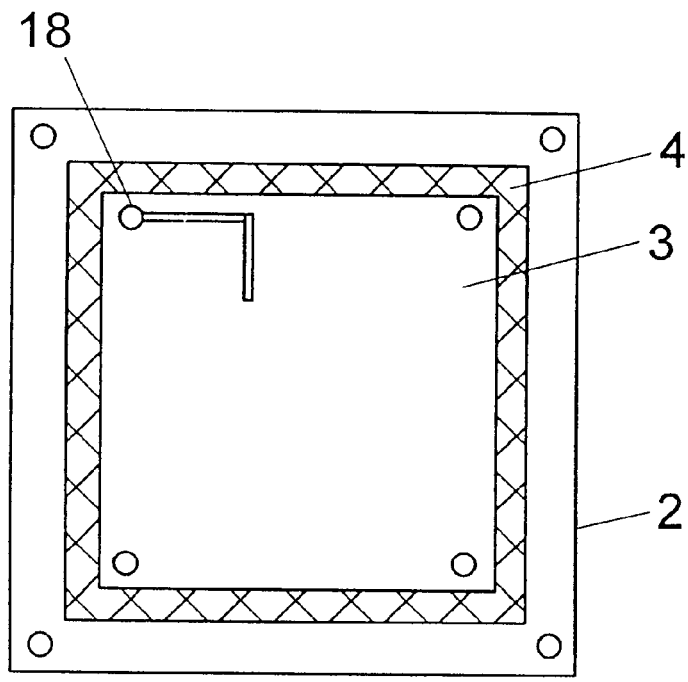

In this embodiment, an electric wave shield layer 4 is formed by depositing a metal material on an inner surface of the sensor housing 2 other than the concave 14. In this case, there are advantages of reducing the production cost of electric wave shield means and downsizing the sensor housing. The shield layer 4 is connected to a zero-voltage point of the capacitance detecting circuit 40. In addition, it is preferred that electrical connections between the electrodes 30, 35 and a printed circuit board 3 mounting electronic parts of the circuit unit, and between the shield layer 4 and the printed circuit board are made by use of a metal film deposited. For example, as shown in FIGS. 9A and 9B, four pillars 18 each having a screw hole in its top surface for supporting the printed circuit board 3 may be formed on four corners of the square bottom wall 10 of the sensor housing 2. A metal film is deposited on a top surface of one of the pillars, and extends to the shield layer. When the printed circuit board 3 is secured to the sensor housing 2 by screws, the zero-voltage point ($\alpha$) of the circuit of the moisture sensor can be connected to the shield layer 4 through the metal film on the pillar 18. Thus, when the shield layer 4 and the electrodes 30, 35 are simultaneously formed on the sensor housing 2 by the deposition method, it is possible to considerably reduce the production cost of the moisture sensor.

As a modification of the above moisture sensor, a pillar having a metal film may be formed in such a height that the top surface of the pillar is exposed through a through hole formed in the printed circuit board. In this case, the printed circuit board is screwed to the another three pillars. The metal film formed to extend from the top surface of the pillar to the shield layer is used to make the connection between the zero-voltage point (α) of the circuit of the moisture sensor and the shield layer.

The shield cover 5 is attached to the printed circuit board. The shield cover 5 is useful to protect the printed circuit board from electric wave of a high frequency zone (several ten MHz~several hundreds MHz), and at the same time prevent emission of the electric wave from the printed circuit board to the outside, which induces the faulty operation of other electric appliances. Therefore, the printed circuit board 3 is housed in a space between the shield cover 5 and the shield layer 4 to shield the printed circuit board from the electric wave. For example, the electrodes 30, 35 are connected to required positions of the printed circuit board 3 through lead wires. In addition, the conductive cover 7 is attached to the top opening of the sensor housing 2. The conductive cover 7 is electrically connected to the zero-voltage point (α) of the circuit of the moisture sensor through a lead wire and the capacitor $C_F$.

Next, a garbage disposing apparatus using the capacitance type moisture sensor of the present invention is explained. Detecting the moisture content in a garbage vessel is important to efficiently proceed decomposition and fermentation of the garbage in the garbage disposing apparatus. When using the moisture sensor of the present invention in the garbage disposing apparatus, it is possible to directly detect the amounts of water over the wide range in the garbage vessel.

For example, the garbage disposing apparatus comprises the garbage vessel, in which Biochip and garbage are put, stirring wings for mixing the garbage with the Biochip, and a catalyst deodorizing means. The moisture sensor of the present invention can be attached to a wall surface of the garbage vessel by use of fixtures such as bolts and nuts such that the outer surface of the electrically-insulating wall 15 is in flush with the inner surface 102 of the garbage vessel 100, as shown in FIG. 7. Therefore, it is preferred that the sensor housing 2 may be formed such that a wall thickness of the garbage vessel is substantially equal to a projection height of the convex 13. In addition, to readily attach the moisture sensor to the garbage vessel, it is preferred to form a guide projection on an outer surface of the sensor housing or the garbage vessel.

Since the electrically-insulating wall 15 of the moisture sensor does not project to the interior of the garbage vessel, it is possible to prevent a situation that the operation of stirring the garbage in the garbage vessel is inhibited. In addition, irrespective of the kinds of garbage such as rice, cereal, tea leaf, leaf of cigarette, wet refuse, wood pieces, soil, or fine aggregate of concrete, it is possible to accurately detect the amounts of water of the garbage left at rest, or the garbage being stirred in the garbage vessel.

In the present invention, since the distance between the inner circumference of the ring-shaped electrode and the outer circumference of the central distance is maintained constant, a leakage of electric flux line is reduced. Thereby, it is possible to reduce the influence of the stray capacitance between the central electrode and the garbage vessel. In addition, since the width of the central electrode, i.e., the diameter of the central electrode, is equal to the width of the ring-shaped electrode, both of these electrodes develop the same amounts of electric flux line. This leads to a further reduction in stray capacitance. As a result, it is possible to stably provide a high detection accuracy of the amounts of water.

As described above, this kind of garbage disposing apparatus treats garbage in the presence of the Biochip in the garbage vessel. Since the Biochip contains moisture, it is necessary to consider the amounts of water of the Biochip to accurately detect the amounts of water in the garbage vessel. For example, when only the garbage occupies the moisture detecting region defined between the electrodes, the output circuit may provide the electrical signal corresponding to only the amounts of water in the garbage. In such a case, the detection accuracy of the amounts of water may decrease.

To further improve the detection accuracy of the moisture sensor, the inventors have found that when the garbage put in the garbage vessel has an average size of about 15 to 20 mm, it is possible to avoid an undesired situation that only the garbage occupies the moisture detecting region. In addition, adequate electrode size and distance between the electrodes were determined according to the following experiment.

Figure 10:
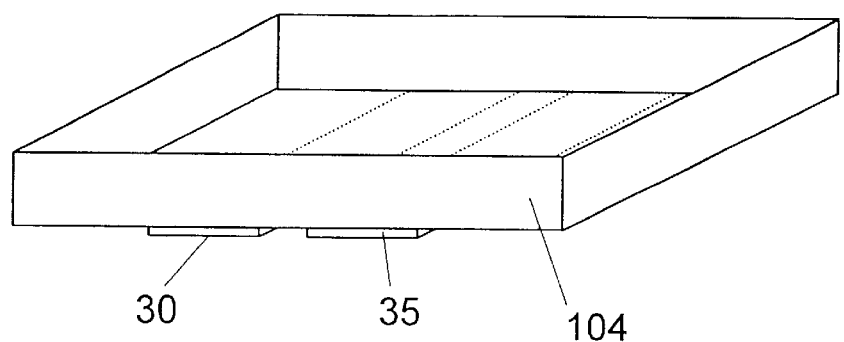
FIG. 10 is a perspective view of a sensor housing with electrodes used in an experiment.

This experiment was carried out by use of a vessel 104 shown in FIG. 10, and three kinds of pairs of electrodes 30, 35. A first pair of electrodes, each of which is made of a copper foil having a thickness of 0.1 mm, a length of 115 mm and a width of 24 mm, were arranged in parallel such that a distance therebetween is 2 mm. A second pair of electrodes, each of which is made of a copper foil having a thickness of 0.1 mm, a length of 115 mm and a width of 10 mm, were arranged in parallel such that a distance therebetween is 30 mm. A third pair of electrodes, which are composed of copper foils having a thickness of 0.1 mm, a length of 115 mm and widths of 5 mm and 25 mm, were arranged in parallel such that a distance therebetween is 20 mm. As the vessel 104, a synthetic resin case having electric insulation was used, which is composed of a square bottom wall having a size of 115 mm and a thickness of 1 mm, side walls projecting from the circumference of the bottom wall by a height of 40 mm, and a top opening. Each pair of the electrodes are attached on an outer surface of the bottom wall of the synthetic resin case.

Figure 11:
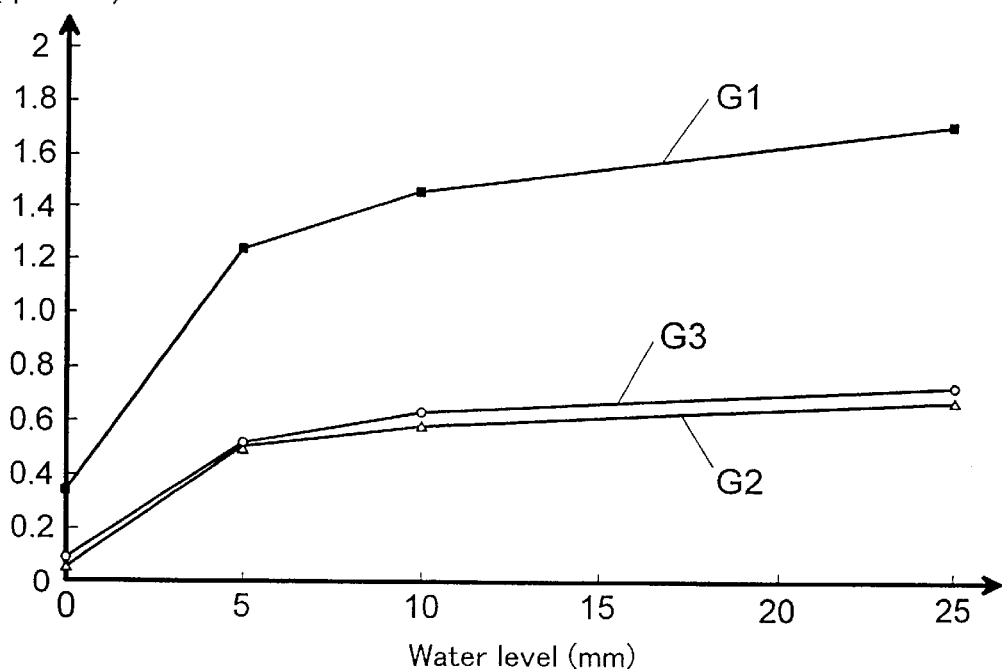
FIG. 11 is a graph showing results of the experiment.

Then, water is put in the synthetic resin case to obtain a required water level. With respect to each of the first to third pairs of electrodes, the capacitance value between the electrodes was measured under three different water levels, i.e., 5 mm, 10 mm and 25 mm. Results are shown in FIG. 11. In this figure, the horizontal axis shows the water level in the synthetic resin case, and the vertical axis shows the capacitance value measured. "G1" designates the capacitance value measured by use of the first pair of electrodes. "G2" designates the capacitance value measured by use of the second pair of electrodes. "G3" designates the capacitance value measured by use of the third pair of electrodes.

Figure 12A:
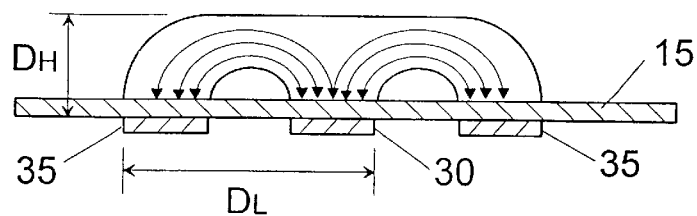
FIGS. 12A and 12B are schematic diagrams showing a preferred electrode arrangement of the moisture sensor.

As shown in FIG. 12A, the moisture detecting region has a critical height $D_H$ from the electrode in a direction perpendicular to the electrically-insulating wall. The capacitance value changes within a range of the critical height or less, i.e., the moisture detecting region. In other words, the capacitance value hardly changes in the outside of the moisture detecting region irrespective of the height of the water level. From the graph of FIG. 11, it has been found that the critical height $D_H$ is equal to about a half of a distance $D_L$ between outer sides of the electrodes arranged in parallel. For example, in the case of using the first electrode pair, the distance $D_L$ between outer sides of the electrodes is 50 mm (=24+2+24), and the critical height $D_H$ is about 25 mm.

Therefore, in the case of using the garbage disposing apparatus with the moisture sensor of FIG. 1, the width dimensions of the electrodes and the distance between the electrodes may be determined, as shown below, to avoid the undesired situation that only the garbage occupies the moisture detecting region.

Figure 12B:
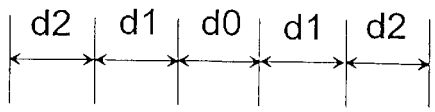
Figure 12B:
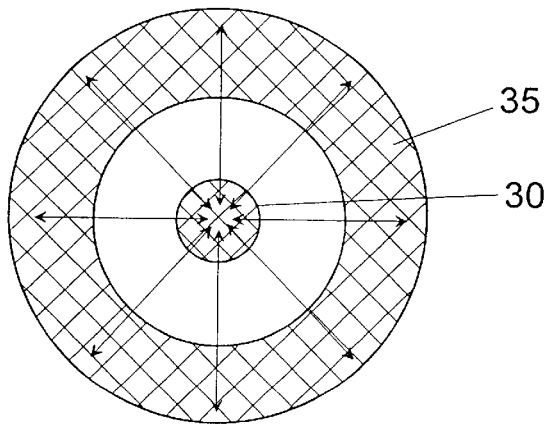

That is, as shown in FIG. 12B, the diameter of central electrode 30 is d0, and the width of the ring-shaped electrode 35 is d2. The distance between the outer circumference of the central electrode and the inner circumference of the ring-shaped electrode is d1. The inner and outer diameters of the ring-shaped electrode are given by d0+(d1*2) and d0+(d1*2)+(d2*2), respectively. In addition, it is preferred that a total distance ($D_L$) that is a sum of d0, d1 and d2 may be determined to be equal to two times or more of the critical height $D_H$. By using the electrode arrangement satisfying this condition, it is possible to further improve the detection accuracy of the moisture sensor used in the garbage disposing apparatus.

Figure 13:
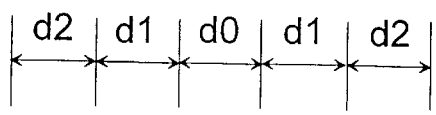
FIG. 13 is a diagram showing a modification of the electrode arrangement.
Figure 13:
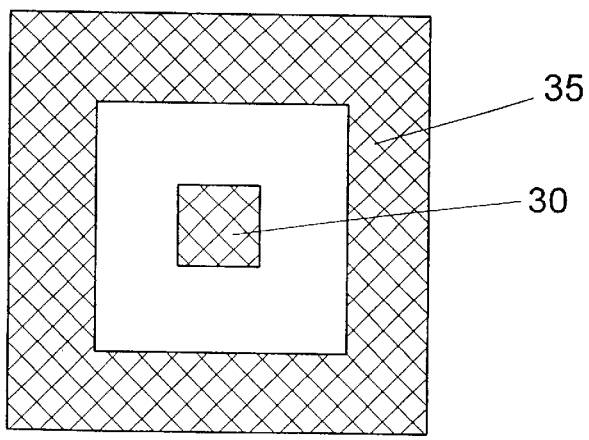

The above condition is also available in the case of using the electrode arrangement composed of a central rectangular electrode and a rectangular ring-shaped electrode. That is, as shown in FIG. 13, the electrodes may be composed of a ring-shaped electrode having a rectangular open center and a central electrode having a rectangular shape. In this case, the central electrode is disposed in the open center of the ring-shaped electrode such that an outer circumference of the central electrode is spaced from an inner circumference of the ring-shaped electrode by a constant distance.

The followings are modifications of the capacitance type moisture sensor of the present invention.

Figure 14:
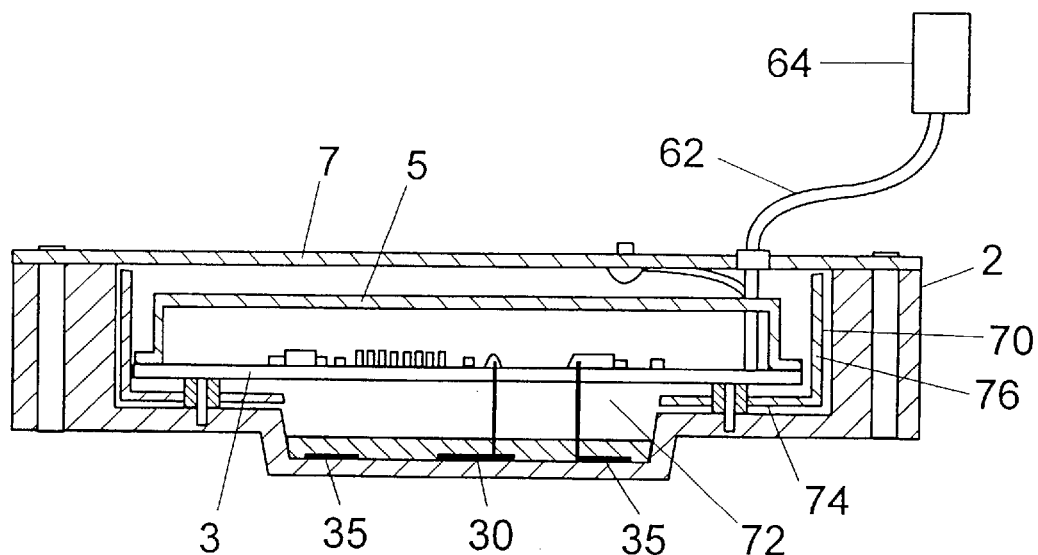
FIG. 14 is a cross-sectional view of a capacitance type moisture sensor with a shield case according to the present invention.

As a modification of the above moisture sensor, as shown in FIG. 14, it is preferred that a shield case 70 is disposed in the sensor housing 2 in place of the shield layer 4. In this case, the shield case 70 is composed of a bottom wall 74 having an aperture 72 and side walls 76 projecting upward from the circumference of the bottom wall, which is disposed in the sensor housing 2 such that the concave 14 is exposed to the interior of the shield case through the aperture 72. The shield case 70 is connected to a zero-voltage point of the capacitance detecting circuit 40.

Figure 15:
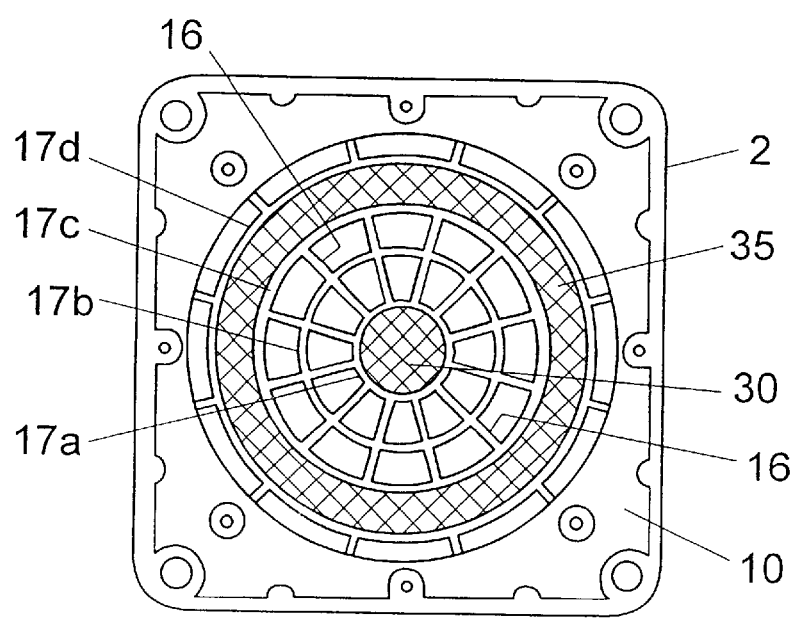
FIG. 15 is a top view showing a modification of the sensor housing.

As another modification of the above moisture sensor, only the first ribs may be formed on the inner surface of the electrically-insulating wall 15. Similarly, only the second rib(s) may be formed on the inner surface of the electrically-insulating wall. For example, as shown in FIG. 15, no first rib 16 may be formed in the region between the second ribs 17c and 17d.

Figure 16A:
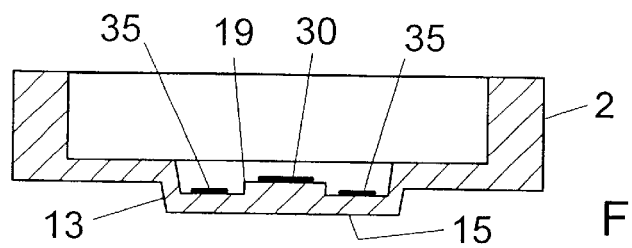
FIGS. 16A and 16B are cross-sectional views showing further modifications of the sensor housing.

In addition, as a modification of the moisture sensor, at least one step may be formed between a first electrode region where the central electrode 30 is formed and a second electrode region where the ring-shaped electrode 35 is formed. For example, the sensor housing 2 shown in FIG. 16A has a central stage 19 formed such that the first electrode region is at a higher position than the second electrode region.

Figure 16B:
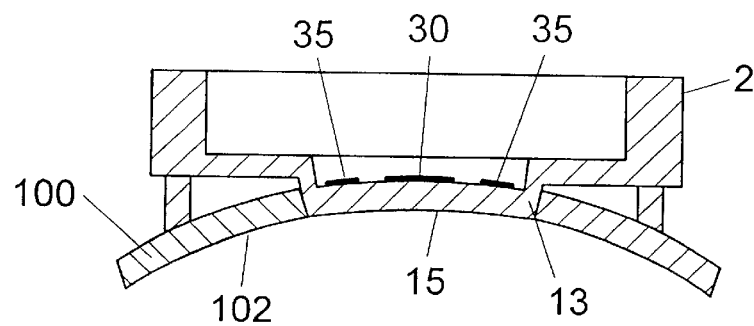

In addition, when the garbage vessel 100 of the garbage disposing apparatus has a curved wall surface 102, it is preferred to use the sensor housing 2 having a curved surface of the electrically-insulating wall 15, as shown in FIG. 16B. In this case, the moisture sensor is attached to the garbage disposing apparatus such that the curved surface of the electrically-insulating wall is in flush with the curved wall surface of the garbage vessel 100.

Figure 17A:
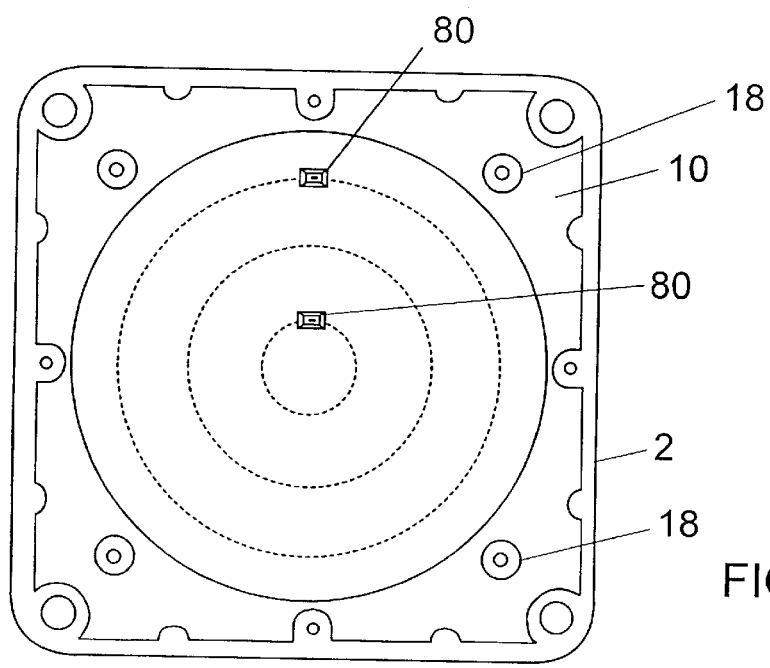
FIGS. 17A and 17B are a top view and a cross-sectional view of another modification of the sensor housing.
Figure 17B:
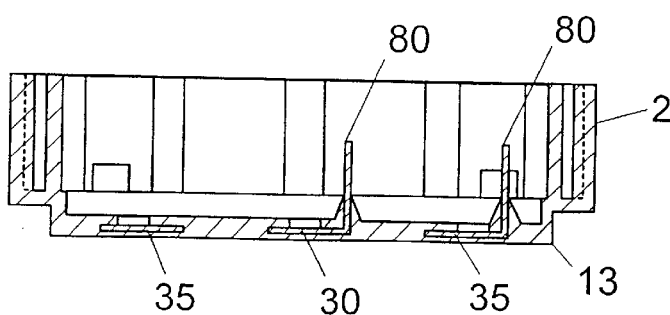
Figure 18A:
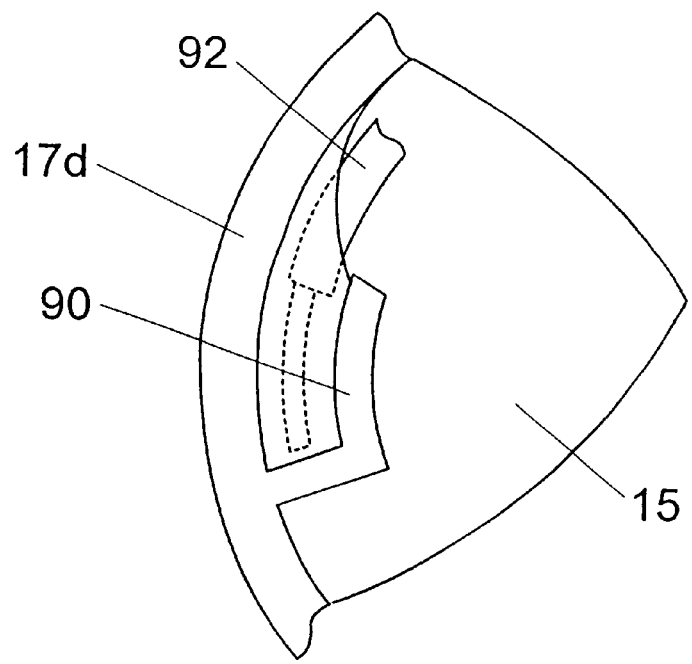
FIGS. 18A and 18B are partially top and cross-sectional views of a sensor housing with a solder joint portion.
Figure 18B:
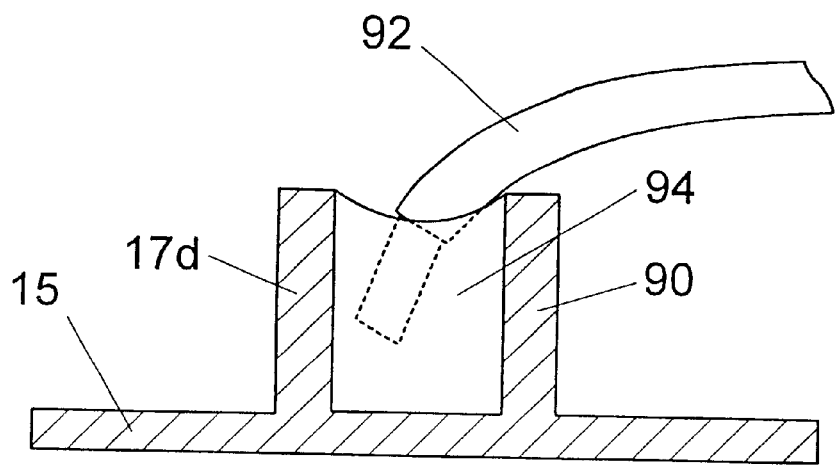

A method of connecting a lead wire to the electrode(s) is not limited. For example, as shown in FIGS. 17A and 17B, a terminal member 80 having an L-shaped cross section may be formed on each of the central electrode 30 and the ring-shaped electrode 35. In this case, it is possible to readily make the electrical connection between the printed circuit board 3 and those electrodes with reliability. Alternatively, as shown in FIGS. 18A and 18B, when a solder joint portion 90 may be formed at a required position adjacent to the second rib 17d, it is possible to connect the lead wire 92 to the electrode by use of a relatively small amount of a solder 94 with reliability, while preventing a leakage of the solder to the outside of the solder joint portion.

Figure 19:
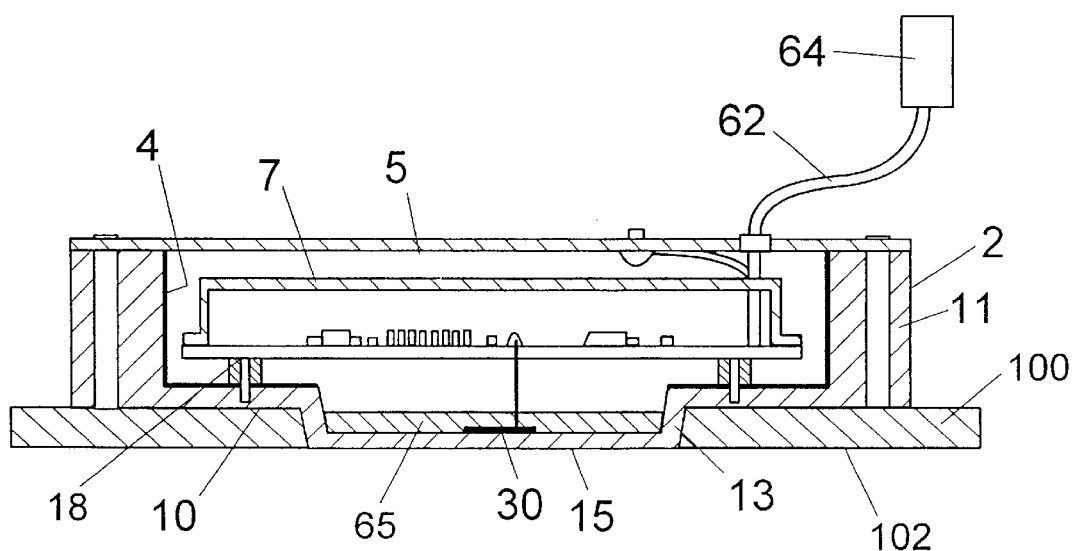
FIG. 19 is a cross-sectional view of a capacitance type moisture sensor according to another preferred embodiment of the present invention.
Figure 20:
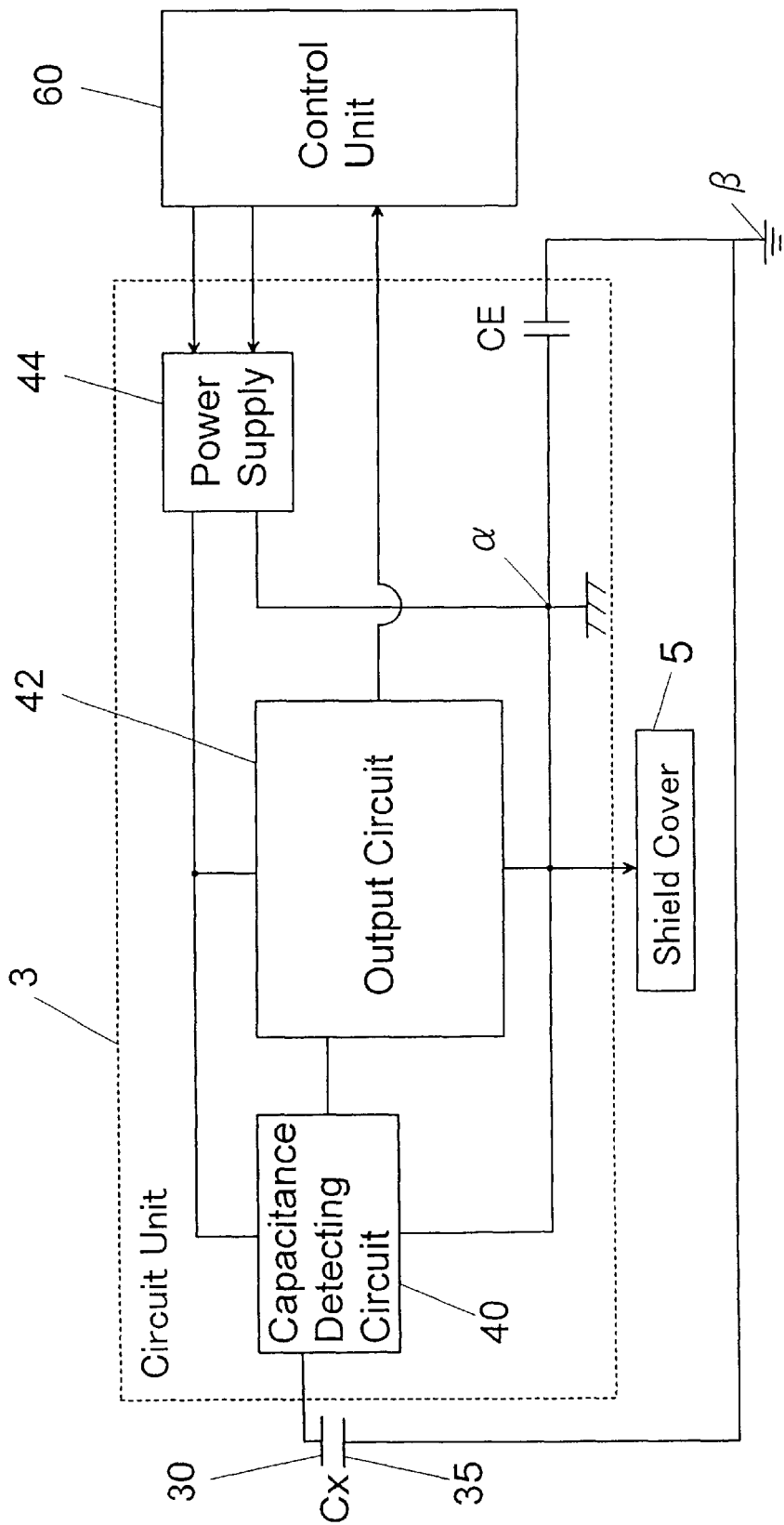
FIG. 20 is a circuit diagram of the moisture sensor of FIG. 19.
Figure 21A:
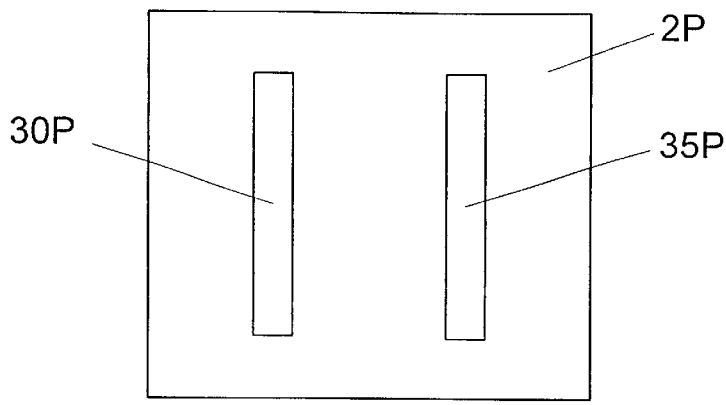
FIGS. 21A and 21B are schematic views of a conventional capacitance type moisture sensor.
Figure 21B:
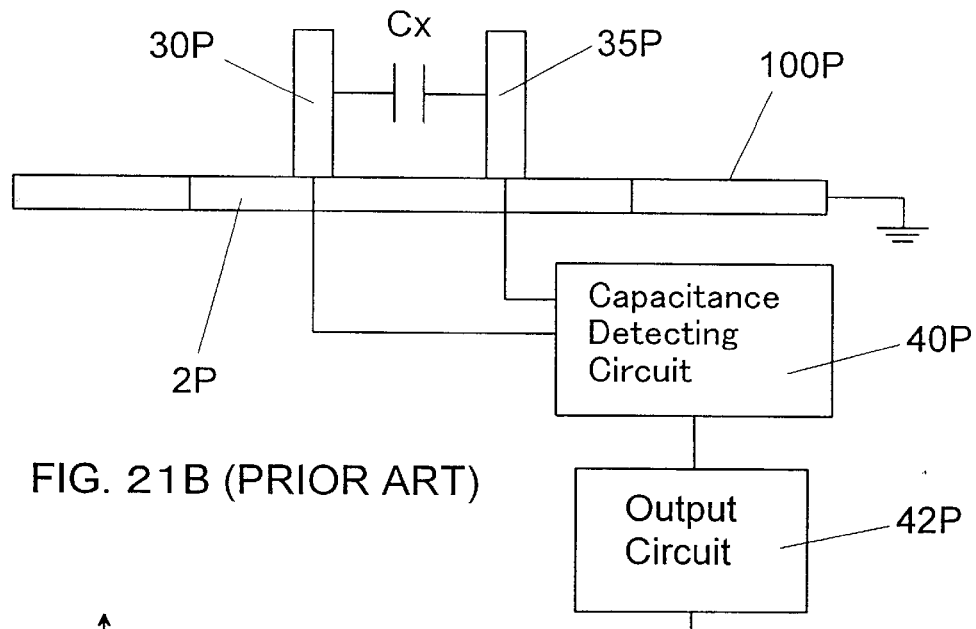
Figure 22:
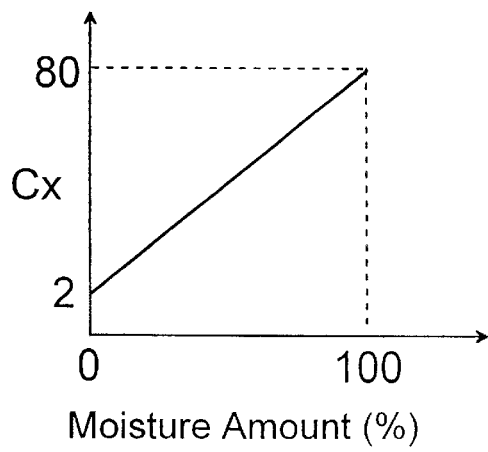
FIG. 22 is a graph showing a relationship between amounts of water and capacitance (Cx).

As a further modification of the moisture sensor described above, when the garbage vessel of the garbage disposing apparatus is made of a metal material, this garbage vessel may be used as one of the electrodes. That is, as shown in FIG. 19, a first electrode 30 is formed on a center of an inner surface of the electrically-insulating wall 15 of the sensor housing 2. A second electrode, which defines the moisture detecting region in cooperation with the first electrode, is provided by the garbage vessel 100 of the metal material. In the circuit unit of this moisture sensor, the garbage vessel 100 is connected to the ground β, as shown in FIG. 20. The other components of the circuit unit are substantially same as that of FIG. 4.

What is claimed is:

1. A capacitance type moisture sensor comprising:
   a sensor housing having an electrically-insulating wall, an outer surface of said electrically-insulating wall facing a space where amounts of water should be detected;
   a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and
   a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit,
   wherein said sensor housing has a concave formed in an inner surface of a bottom wall thereof, and a convex formed on an outer surface of the bottom wall at a position opposed to said concave, and wherein a bottom surface of said concave is the inner surface of said electrically-insulating wall and a top surface of said convex is the outer surface of said electrically-insulating wall.

2. The capacitance type moisture sensor as set forth in claim 1, wherein said at least one of electrodes is a metal film deposited on the inner surface of said electrically-insulating wall.

3. The capacitance type moisture sensor as set forth in claim 1, wherein said pair of electrodes are composed of a ring-shaped electrode having an open center and a central electrode, which is disposed in the open center of said ring-shaped electrode such that an outer circumference of said central electrode is spaced from an inner circumference of said ring-shaped electrode by a constant distance.

4. The capacitance type moisture sensor as set forth in claim 3, wherein a width of said ring-shaped electrode is substantially equal to the width of said central electrode.

5. The capacitance type moisture sensor as set forth in claim 1, wherein said pair of electrodes are composed of a ring-shaped electrode having an annular open center and a central electrode having a circular shape, and wherein said ring-shaped electrode is disposed in a concentric manner with respect to said central electrode such that an outer circumference of said central electrode is spaced from an inner circumference of said ring-shaped electrode by a constant distance.

6. The capacitance type moisture sensor as set forth in claim 1, wherein said sensor housing has a plurality of first ribs projecting on the inner surface of said electrically-insulating wall, which substantially extend in directions of electric field developed between said electrodes.

7. The capacitance type moisture sensor as set forth in claim 1, wherein said sensor housing has at least one second rib projecting on the inner surface of said electrically-insulating wall such that an extending direction of said second rib is substantially perpendicular to a direction of electric field developed between said electrodes.

8. The capacitance type moisture sensor as set forth in claim 1, wherein said circuit unit comprises a signal processing means for detecting an unusual state by comparing a change of the amounts of water corresponding to said electric signal provided from said output circuit with a predetermined value.

9. The capacitance type moisture sensor as set forth in claim 1, wherein an exposed surface of each of said electrodes is coated with an electrically-insulating material.

10. The capacitance type moisture sensor as set forth in claim 1, comprising a shield case composed of a bottom wall having an aperture and side walls projecting upward from the circumference of said bottom wall, which is disposed in said sensor housing such that said concave of said sensor housing is exposed to the interior of said shield case through said aperture, and wherein said shield case is connected to a zero-voltage point of said capacitance detecting circuit.

11. The capacitance type moisture sensor as set forth in claim 10, comprising a shield cover disposed in said sensor housing, and wherein a printed circuit board mounting electronic parts of said circuit unit is housed between said shield case and said shield cover.

12. The capacitance type moisture sensor as set forth in claim 1, wherein said pair of electrodes are formed on bottom of said concave, and then an electrically-insulating material is filled in said concave.

13. The capacitance type moisture sensor as set forth in claim 1, comprising an electric wave shield layer formed by depositing a metal material on an internal surface of said sensor housing other than said concave, and wherein said shield layer is connected to a zero-voltage point of said capacitance detecting circuit.

14. The capacitance type moisture sensor as set forth in claim 13, wherein electrical connections between said electrodes and a printed circuit board mounting electronic parts of said circuit unit, and between said electric wave shield layer and said printed circuit board are made by use of a metal film deposited.

15. The capacitance type moisture sensor as set forth in claim 1, wherein said at least one of electrodes is a metal film formed on the inner surface of said electrically-insulating wall by means of an insert molding.

16. The capacitance type moisture sensor as set forth in claim 1, wherein said at least one of electrodes is a metal film bonded on the inner surface of said electrically-insulating wall.

17. A garbage disposing apparatus comprising the capacitance type moisture sensor as set forth in claim 1.

18. A capacitance type moisture sensor comprising:

a sensor housing having an electrically-insulating wall, an outer surface of said electrically-insulating wall facing a space where amounts of water should be detected;

a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, wherein said pair of electrodes are composed of a ring-shaped electrode having a rectangular open center and a central electrode having a rectangular shape, which is disposed in the open center of said ring-shaped electrode such that an outer circumference of said central electrode is spaced from an inner circumference of said ring-shaped electrode by a constant distance.

19. A capacitance type moisture sensor comprising:

a sensor housing having an electrically-insulating wall, an outer surface of said electrically-insulating wall facing a space where amounts of water should be detected;

a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, wherein said pair of electrodes are composed of a ring-shaped electrode having an open center and a central electrode, which is disposed in the open center of said ring-shaped electrode such that an outer circumference of said central electrode is spaced from an inner circumference of said ring-shaped electrode by a constant distance, and wherein said sensor housing has a plurality of first ribs projecting on the inner surface of said electrically-insulating well, which radially extend from a center of said central electrode.

20. A capacitance type moisture sensor comprising:

a sensor housing having an electrically-insulating wall, an outer surface of said electrically-insulating wall facing a space where amounts of water should be detected;

a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, wherein said pair of electrodes are composed of a ring-shaped electrode having an open center and a central electrode, which is disposed in the open center of said ring-shaped electrode such that an outer circumference of said central electrode is spaced from an inner circumference of said ring-shaped electrode by a constant distance, and wherein said sensor housing has at least one second rib projecting on the inner surface of said electrically-insulating well, which extends in a concentric manner with respect to said central electrode.

21. A capacitance type moisture sensor comprising:

a sensor housing having an electrically-insulating wall, an outer surface of said electrically-insulating wall facing a space where amounts of water should be detected;

a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, an additional metal layer formed on a metal film by metal plating, wherein said at least one of electrodes is said metal film deposited on the inner surface of said electrically-insulating wall.

22. A method of producing a capacitance type moisture sensor comprising the steps of:

molding a synthetic resin material to obtain said sensor housing;

depositing a metal material to form a metal film on said sensor housing; and selectively removing said metal film from said sensor housing to obtain said pair of electrodes, wherein said capacitance type moisture sensor includes:
 a sensor housing having an electrically-insulating wall, an outer surface of said electrically-insulating wall facing a space where amounts of water should be detected;
 a pair of electrodes disposed on said sensor housing such that at least one of said electrodes is formed on an inner surface of said electrically-insulating wall, and said electrodes are spaced from each other along said electrically-insulating wall, electric field developed between said electrodes being defined as a moisture detecting region; and
 a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit.

23. A capacitance type moisture sensor comprising:

a sensor housing having an electrically-insulating wall, an outer surface of said electrically-insulating wall facing a space where amounts of water should be detected;

a pair of electrodes disposed on said sensor housing, at least one of which is formed on an inner surface of said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, wherein said pair of electrodes are composed of a ring-shaped electrode having an open center and a central electrode, which is disposed in the open center of said ring-shaped electrode such that an outer circumference of said central electrode is spaced from an inner circumference of said ring-shaped electrode by a constant distance, and wherein said sensor housing has a concave formed in an inner surface of a bottom wall thereof, and a convex formed on an outer surface of the bottom wall at a position opposed to said concave, and wherein a bottom surface of said concave is the inner surface of said electrically-insulting wall and a top surface of said convex is the outer surface of said electrically-insulting wall.

24. A capacitance type moisture sensor comprising:

a sensor housing having an electrically-insulating wall, an outer surface of said electrically-insulating wall facing a space where amounts of water should be detected;

a pair of electrodes disposed on said sensor housing, at least one of which is formed on an inner surface of said electrically-insulating wall, electric field developed between said electrodes being defined as a moisture detecting region; and a circuit unit including a capacitance detecting circuit for detecting a capacitance value between said electrodes, which changes in response to the amounts of water in said moisture detecting region, and an output circuit for providing an electrical signal corresponding to the amounts of water according to the capacitance value detected by said capacitance detecting circuit, wherein said sensor housing has a concave formed in an inner surface of a bottom wall thereof, and a convex formed on an outer surface of the bottom wall at a position opposed to said concave, and wherein a bottom surface of said concave is the inner surface of said electrically-insulating wall and a top surface of said convex is the outer surface of said electrically-insulating wall, said capacitance type moisture sensor further comprising an electric wave shield layer formed by depositing a metal material on an internal surface of said sensor housing other than said concave, and wherein said shield layer is connected to a zero-voltage point of said capacitance detecting circuit.

* * * * *